United States Patent [19]
Koh et al.

[11] Patent Number: 5,933,358
[45] Date of Patent: Aug. 3, 1999

[54] METHOD AND SYSTEM OF PERFORMING VOLTAGE DROP ANALYSIS FOR POWER SUPPLY NETWORKS OF VLSI CIRCUITS

[75] Inventors: Han Young Koh, Fremont; Tak K. Young, Cupertino; Jeh-Fu Tuan, San Jose, all of Calif.

[73] Assignee: Synopsys, Inc., Mountain View, Calif.

[21] Appl. No.: 08/940,627

[22] Filed: Sep. 30, 1997

[51] Int. Cl.⁶ .............................. G06F 17/50; G06F 17/60; G06F 19/00
[52] U.S. Cl. .......................................................... 364/578
[58] Field of Search ........................ 364/578; 395/500.36, 395/500.39

[56] References Cited

U.S. PATENT DOCUMENTS

| | | | |
|---|---|---|---|
| 5,349,542 | 9/1994 | Brasen et al. | 364/578 |
| 5,404,310 | 4/1995 | Mitsuhashi | 364/490 |
| 5,553,008 | 9/1996 | Huang et al. | 364/578 |
| 5,598,348 | 1/1997 | Rusu et al. | 364/491 |

OTHER PUBLICATIONS

Freeman et al., "Automated Extraction of Spice Circuit Methods from Symbolic Gate Matrix Layout with Pruning," IEEE 23rd Design Automation Conf., 1986, pp. 418–424.

Primary Examiner—Kevin J. Teska
Assistant Examiner—Hugh Jones
Attorney, Agent, or Firm—Wagner, Murabito & Hao

[57] ABSTRACT

A method for testing for power supply network voltage drop violations in an integrated circuit through a computer simulation. First, the IC chip area is divided into a number of discrete regions. The simulation time is divided into a number of time segments. Next, the average aggregate currents corresponding to the transistors for each of the regions are calculated for each of the time segments. Only when a peak average current occurs for any one of the plurality of regions is the power supply network of the IC chip simulated for that time segment. Based on the voltage drops as determined by the power network simulation, violation conditions can be easily identified. Thus, the power network of the IC chip is simulated only when there is found to be high switching activity in some region of the chip. This is more efficient than performing power network voltage drop analyses all the time, even when switching activity throughout the chip is low and the likelihood of any voltage drop violations is very low.

22 Claims, 9 Drawing Sheets

METHOD AND SYSTEM OF PERFORMING VOLTAGE DROP ANALYSIS FOR POWER SUPPLY NETWORKS OF VLSI CIRCUITS

FIELD OF THE INVENTION

The present invention relates to a method and system of performing voltage drop analysis for the power supply networks of VLSI circuits for purposes of testing and troubleshooting.

BACKGROUND OF THE INVENTION

A highly specialized field, commonly referred to as "electronic design automation" (EDA), has evolved to handle the demanding and complicated task of designing semiconductor chips. In EDA, computers are extensively used to automate the design process. Computers are ideally suited to performing tasks associated with the design process because computers can be programmed to reduce or decompose large, complicated circuits into a multitude of much simpler functions. Thereupon, the computers can be programmed to iteratively solve these much simpler functions. Indeed, it has now come to the point where the design process has become so overwhelming that the next generation of integrated circuit (IC) chips cannot be designed without the help of computer-aided design (CAD) systems.

And after the circuit for a new semiconductor chip has been designed and physically laid out, there still remains extensive testing which must be performed to verify that this new design and layout works properly. A multitude of different combinations of test vectors are applied as inputs to the design in order to check that the outputs are correct. In the past, many prior art testing and reliability tools assumed a constant voltage source. This approach was deficient because although the design might be functioning perfectly from a logic standpoint, it might, nevertheless, still not meet specifications due to hidden voltage drop problems. In real life, each of the transistors of a semiconductor circuit has an associated voltage drop. This voltage drop is due to the resistance of interconnect wires that connect power supply pads to circuit devices (e.g., transistors) and the current flowing through them. Individually, the voltage drop of a wire attributable to a single transistor is negligible. However, due to rapid advances in semiconductor technology, today's chips can contain upwards of ten million or more transistors. The cumulative effect of all these voltage drops may lead to serious performance degradation or even critical failures. This is especially the case in low-power and high performance designs, whereby the performance as well as functionality of the design are adversely affected by voltage drops (also called IR drop) in the power supply network. If supply voltage level at a device is decreased due to IR drop, the device may not switch at the right time causing malfunction of the chip or it may significantly slow down the speed of the chip.

Moreover, due to the increased resistance of long and narrow interconnect wires in deep submicron(<=0.35 um) VLSI chips, voltage drop in power supply network has become a serious concern to many designers. Accordingly, most high performance IC design companies have added a thorough voltage drop analysis step in their design flow, whereby after physical design(layout) of the chip has been completed, resistors and capacitors from the power network are extracted and backannotated to the original transistor-level netlist to accurately simulate the impact of the voltage drop in the power network on the circuit performance. The "RailMill" tool, available from Synopsys Inc. is the first commercial reliability simulator being used by many IC design companies today that can accurately analyze power network voltage drop of the network.

However, being a transient circuit behavior, accurate analysis of voltage drop in a power network requires dynamic simulation of the circuit based on input vectors. Considering today's large VLSI designs with multi-million transistors, a typical power network is so huge that a single analysis takes from many hours to a few days to complete, depending on the size of the design and the length and accuracy of the simulation.

Thus, there exists a need in the prior art for some method and system which effectively, efficiently, and quickly performs a voltage drop analysis of the power supply network for VLSI designs. The present invention provides one such method and scheme. Basically, the present invention accurately analyzes voltage drops in the power supply network of a VLSI circuit that is much faster than with conventional prior art methods by simulating the power network of the chip only in those instances when there is high switching activity in defined regions of the chip.

SUMMARY OF THE INVENTION

The present invention pertains to a method for accurately analyzing voltage drops in the power supply network of a VLSI circuit which is much faster than with conventional prior art methods. The present invention is able to achieve the faster speed mainly by simulating the power network of the chip only when there are high switching activity in some region of the chip. It has been discovered that it is not meaningful to analyze the power network voltage drop when switching activity throughout the chip is low because the voltage drop in the power network would be small due to low current levels in the interconnect wires. Conversely, most of the problems and voltage drops of interest occur during peak switching activity. Thus, the present invention determines these times of interest and performs voltage drop analyses only during these critical times.

There are many different ways in which the present invention may be implemented, but in the currently preferred embodiment, the entire chip area is divided into multiple regions. Each transistor in the transistor netlist is assigned to one of those regions. The entire simulation duration is then sliced into equal length intervals or "segments" based on the required simulation accuracy. As the transistor power simulation progresses, the aggregate current of all the transistors in each region is summed up and averaged over the present segment, the "segment average current" of that region. The power supply network is then analyzed only when segment average current in one or more of those regions, including one representing the entire chip area, reaches a local peak. To further accelerate the simulation, once -a current peak is detected in a region, all future peaks of the region smaller than the latest one are ignored until a bigger peak occurs. Node voltages in the power network are calculated and monitored during the power network simulation to detect any drop below the user specified threshold. If a voltage drop violation occurs at any node, the simulation segment, magnitude of the violation, and location of the node are reported in a disk file for graphical display to the human designer or engineer once the simulation is finished.

BRIEF DESCRIPTION OF THE DRAWINGS

The operation of this invention can be best visualized by reference to the drawings.

DETAILED DESCRIPTION

A method and system of performing voltage drop analysis for the power supply networks of VLSI circuits is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

Figure 1:
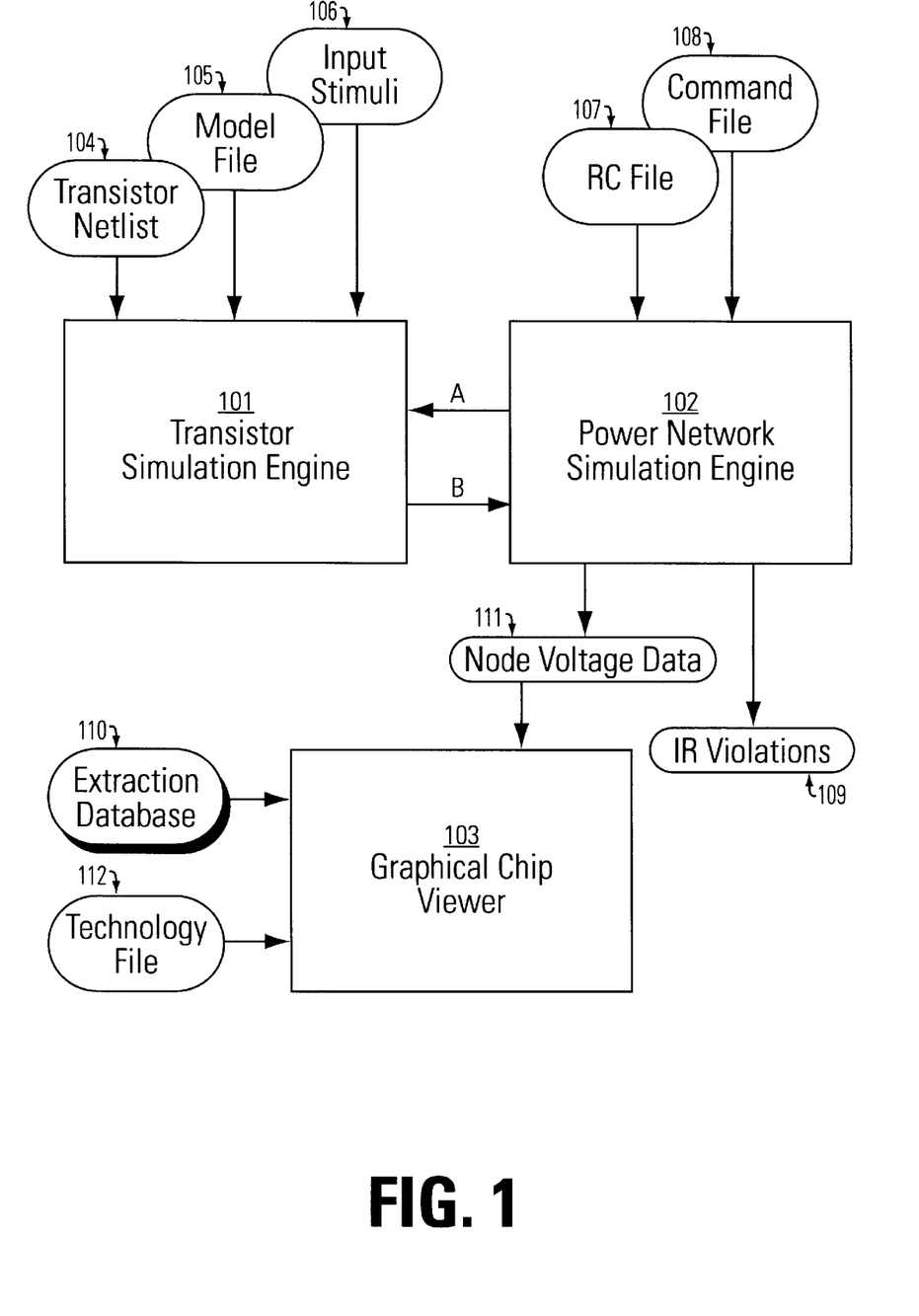
FIG. 1 shows a diagram describing the basic blocks corresponding to the preferred embodiment of the invented voltage drop analysis method.

Referring now to FIG. 1, a diagram describing the basic blocks corresponding to the preferred embodiment of the invented voltage drop analysis method is shown. The entire system generally consists of three major components: transistor simulation engine 101, power network simulation engine 102, and graphical chip viewer 103. The transistor simulation engine 101 is an event-driven transistor-level circuit simulator that calculates the current of each transistor attached to the power network of the transistor netlist 104 based on the input stimuli 106. The characteristics of the particular transistor, is given in model file 105. The engine stores the transistor currents in its output buffer and flushes the buffer at the end of each simulation segment for the power network simulation engine 102 to process the transistor currents. The power network simulation engine 102 divides the chip area into regions as specified by a user per command file 108. Alternatively, if the user does not choose to select specific regions, default regions are calculated by the system based on the chip size. The power network simulation engine 102 then updates the segment average current for each region. It also simulates the power supply RC network according to the RC file 107, whenever it detects a current peak in one or more of the regions to calculate the node voltages of the power network. If any voltage drop violation is detected, each violation is logged into a disk file 109. The graphical chip viewer 103 displays the chip geometries from the extraction database 110 and overlays the voltage drop violation data 109 on top of them for the designer to pinpoint the problem areas on the chip. The technology file 112 specifies the particular technology applicable to the chip.

Figure 2:
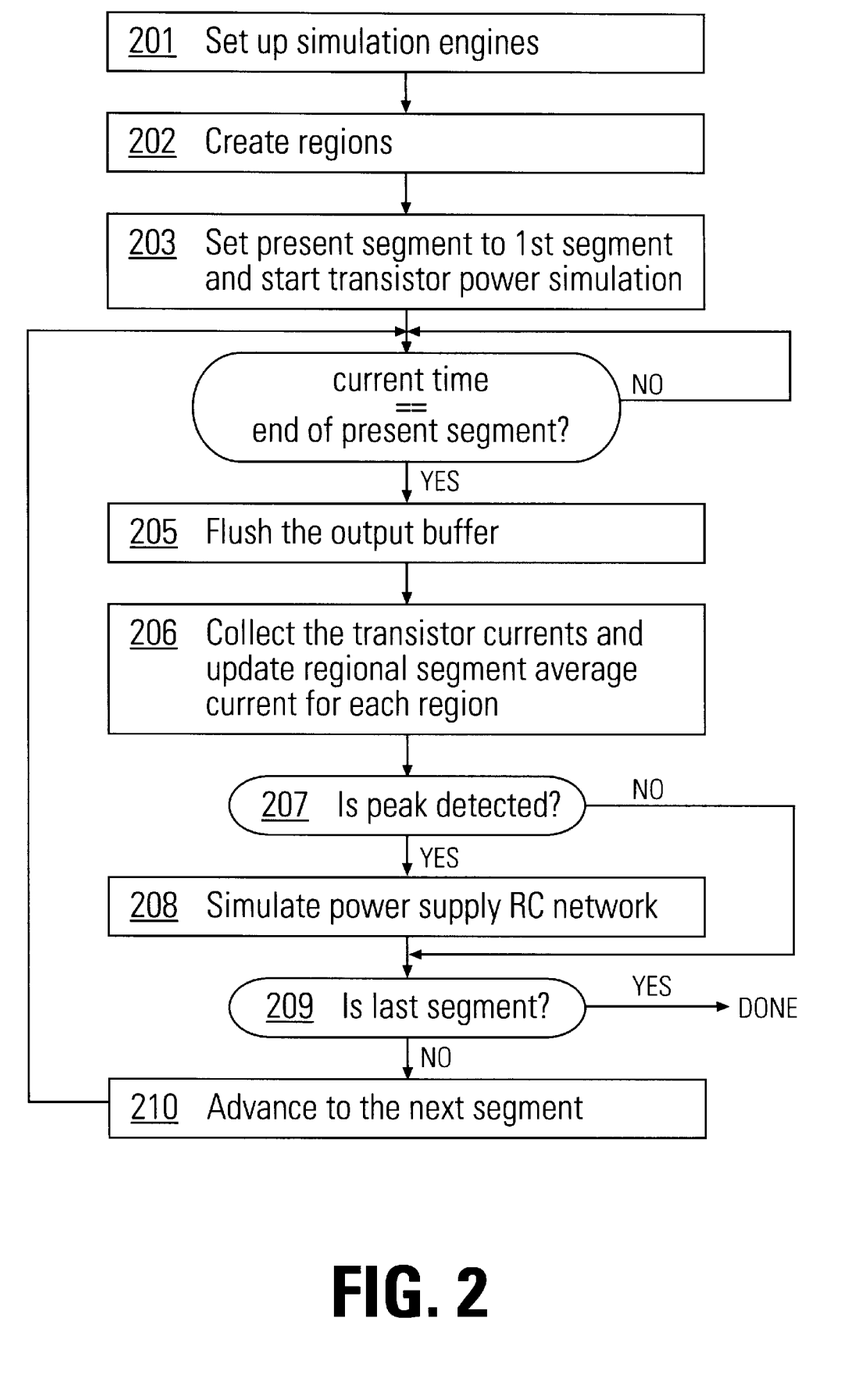
FIG. 2 shows the overall process of the invented method optimized for the preferred embodiment.

The overall algorithm of the invented method optimized for the preferred embodiment shown in FIG. 1 is illustrated in FIG. 2. The first step 201 involves setting up the simulation engines. This includes the steps of reading in the transistor netlist, model, and stimuli files; reading in the power supply RC extraction and user command files; and dividing the simulation duration into equal segments. In the second step 202, the regions are created by dividing the chip into m by n regions and assigning each transistor into one of these regions. The present segment is then set to the first segment, and the transistor power simulation is started, step 203. A determination is made in step 204 as to whether the current time equals the end of the present segment. If the current time equals the end of the present segment, then the output buffer is flushed, step 205. The transistor currents are collected, and the regional segment average current is updated for each region, step 206. A determination is made as to whether a peak is detected in step 207. If a peak is detected, step 208 is performed. Otherwise, step 208 is skipped. Step 208 simulates the power supply RC network. This includes calculating node voltages of the power network as well as detecting and reporting any voltage drop violation. Step 209 determines whether this is the last segment. If it is the last segment, the process is done. Otherwise, the process advances to the next segment per step 210, and the process repeats from step 204.

A more detailed description of each of the above essential steps is now presented. Two types of simulation engines are required for an accurate analysis of power network voltage drop in VLSI circuits. One is a transistor-level power simulation engine that calculates the time-domain current waveform of each transistor connected to the power supply network. The other is an RC network simulation engine that calculates time-domain voltage waveform of each node of the power supply network. To be able to simulate large VLSI circuits in reasonable amount time, the transistor simulation engine needs to be event-driven, (i.e., to simulate transistors in the circuit only when there is enough voltage change in their input). The event-driven nature of the transistor simulation engine requires a special set-up process in order for the RC network simulation engine to collect transistor currents at the end of every segment.

Figure 3:
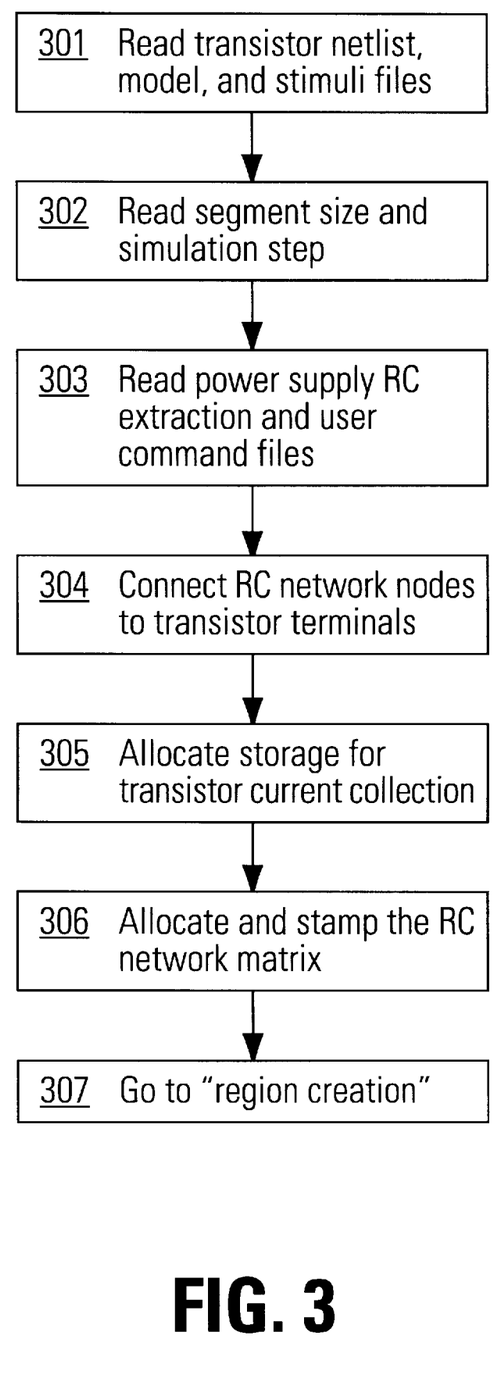
FIG. 3 is a flowchart describing the steps for performing the simulation engine set-up process.

FIG. 3 is a flowchart describing the steps for performing the simulation engine set-up process. Initially, the transistor netlist and model files which are needed for building a simulation netlist and a device model table are read, step 301. In addition, a stimuli file is also read in step 301 into the system to provide input stimulus to the simulation netlist. Next, the size of the segment and the simulation resolution (also called simulation step size) are read in from the user command file, step 302. The entire simulation duration is then divided into many such segments. The size of the segment should be integer multiple of the simulation step size. The transistor simulation engine monitors transistor current change at every simulation step and adds the changes to the output buffer and flushes the buffer at the end of every segment. The RC network simulation engine collects the current changes and calculates the segment average value of each transistor at the end of each segment, that are then used to drive the RC network. Thereupon, a power supply RC extraction file(s) is input to build a power supply RC network, step 303. The command file specifies a voltage drop threshold value and its duration that the designer considers as a violation. The next step 304 is to connect each node in the power supply RC network to the corresponding transistor terminal in the transistor netlist since current waveform needs to be reported only for those transistors that drive the RC network. This stitching has been done by mapping transistor terminal names to the RC network node names based on extraction tool specific naming convention and a user-provided name mapping table. Once the connection between the transistor simulation and the RC network simulation engines have been established, storage area (implemented as an array) is allocated to maintain both the running average and segment average currents of each power net transistor, step 305. Each resistor in the extraction file is recorded in (i, i), (i, j), (j, i), and (j, j) locations of the RC network conductance matrix with the values of G, −G, −G, and G respectively, where G is the conductance of the resistor, step 306. Each capacitor in the extraction file is represented by its linearized model based on the segment size and similarly stamped into the conductance matrix, step 306. Lastly, the process executes the region creation process, step 307.

Figure 4:
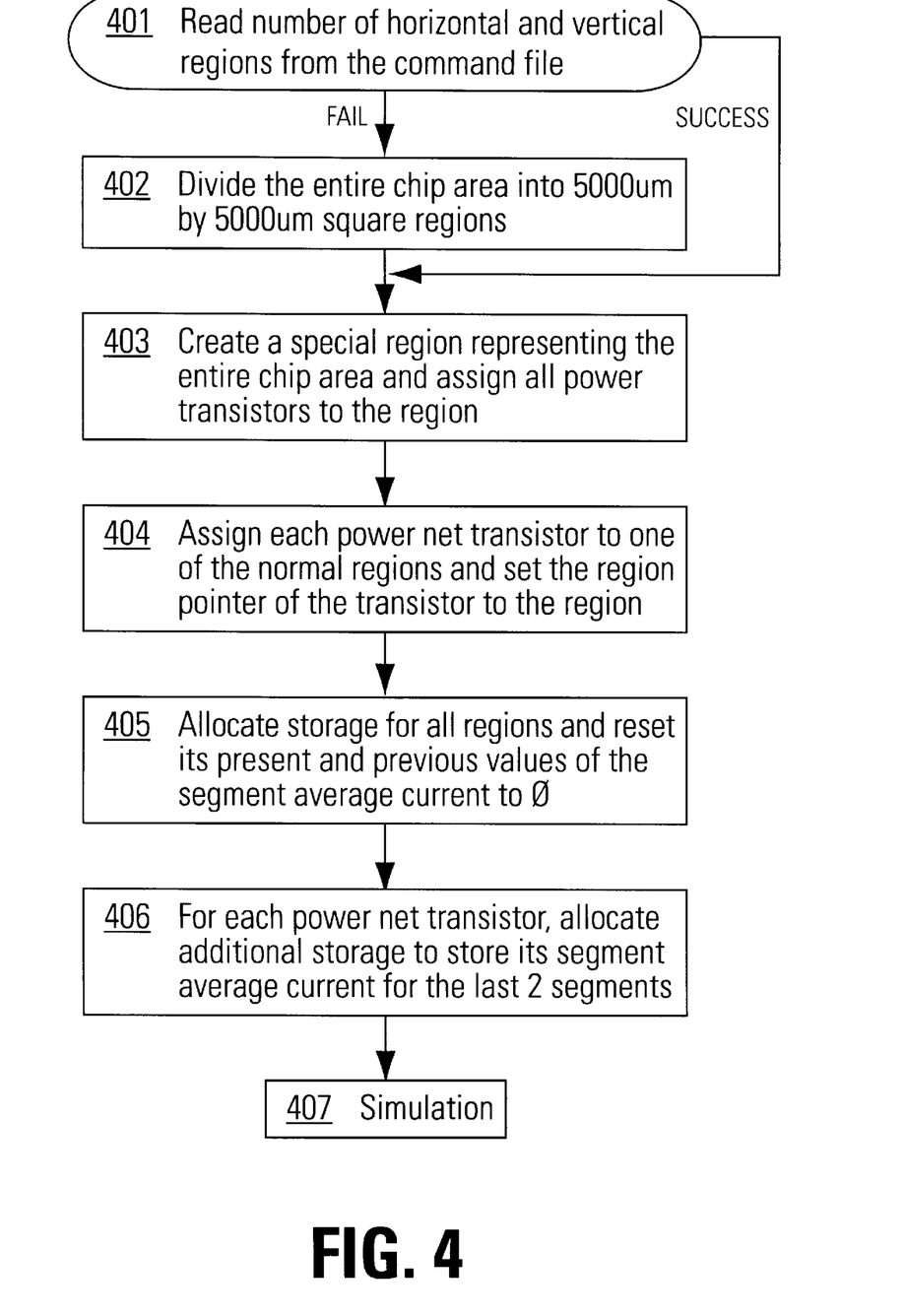
FIG. 4 is a flowchart describing the steps for performing the region creation process.

FIG. 4 is a flowchart describing the steps for performing the region creation process. This process basically divides the chip area into multiple regions. By thusly dividing the chip, one can keep track of switching activity of each region in the chip. Initially, the process reads the number of horizontal and vertical regions from the command file, step 401. If the number of regions in horizontal and vertical directions are specified in the user command file, those values are input and used in step 403 of the process. However, if any of the two criteria is missing, the chip area is divided into 5000 um by 5000 um square regions by step 402. In step 403, a special region representing the entire chip area is also added in addition to the normal regions created in step 401. The regions created in steps 401 and 402 are used to monitor the regional as well as overall switching activities during each simulation segment. To calculate the regional current (a regional current is defined as the total sum of the current of the transistors in the region at any simulation time), power net transistors need to be assigned to a region based on their location, step 404. The location of a transistor is derived from one of its terminals connected to the RC network node because X and Y coordinates of the RC node are specified in the RC extraction file. Each power net transistor is also assigned to the special region created in step 403 in order to monitor the switching activity of the entire chip. Once regions are created, an array of C structures representing the region is allocated in virtual memory of the program. The C structure includes data fields for the present and previous regional segment average current values as well as a flag that indicates whether the current value is going up or down to keep track of peaks, step 405. Additional storage is allocated in the C structure representing a power net transistor to store the average current values for the present and previous simulation segments to go back one or two segments in time when a current peak is detected in the present segment, step 406. Thereupon, the simulation process can start, step 407.

Figure 5:
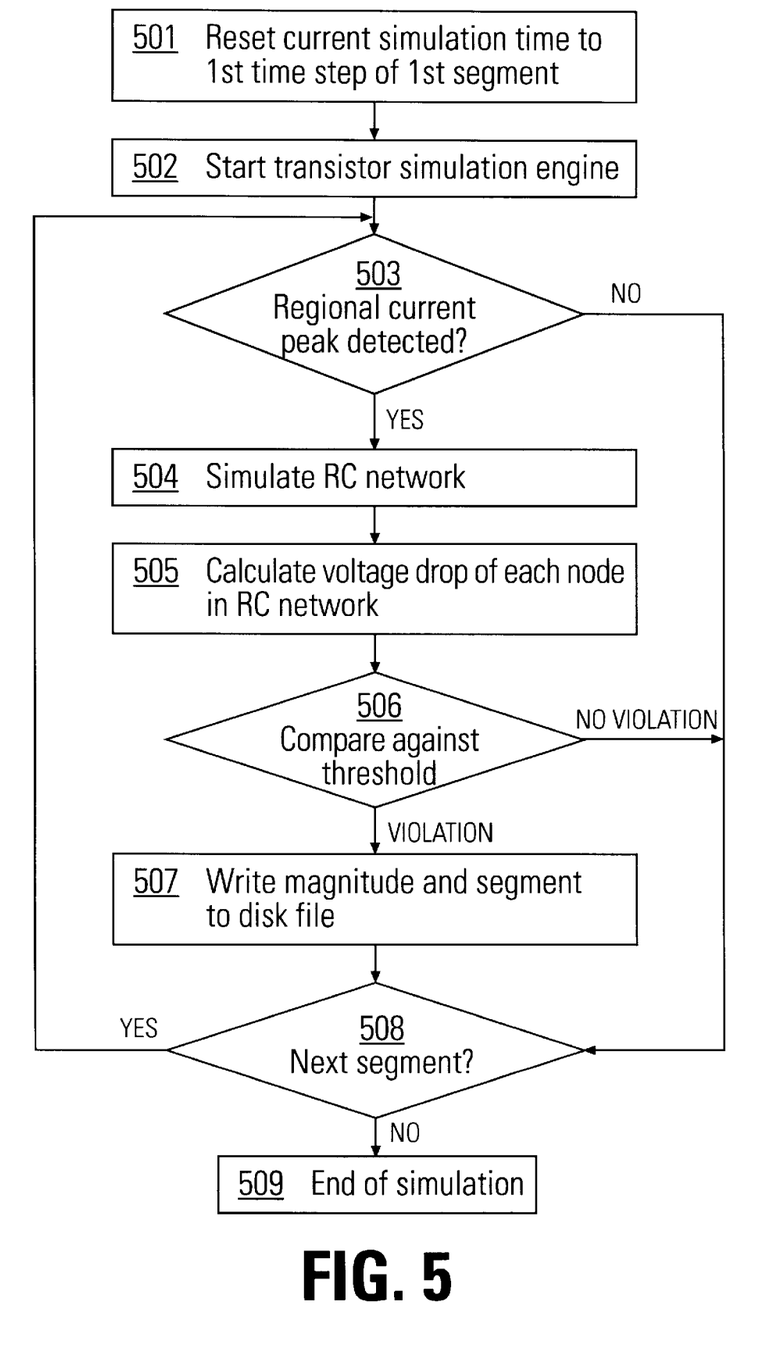
FIG. 5 is a flowchart describing the steps for performing the power network voltage drop analysis.

As discussed above, the power network voltage drop analysis is performed only when a current peak is detected in one or more of the regions. Details of this process is presented in the flowchart of FIG. 5. Initially, the current simulation time is reset to the first time step of the first segment, step 501. The transistor simulation engine is started in step 502. The transistor engine simulates the transistor netlist until the end of the current segment at which time it flushes its output buffer for the RC network simulation engines to update segment average currents of each transistor as well as of each region. If, in step 503, a regional current peak is detected in one or more regions, the RC network engine simulates the RC network and calculate the voltage drop, of each node in the RC network, steps 504 and 505. Once the voltage drop is calculated, it is compared in step 506 against the user provided threshold. If a violation occurs, both the magnitude and the segment are written to a disk file for later inspection, step 507. The simulation time moves to the beginning of the next segment step 508 and the step 503 is repeated until the end of the simulation duration, step 509.

Analyzing the voltage drop of the power supply network requires formation of the matrix equation, Yv=i, where the dimension of the vectors v and i is the number of nodes in the RC network and Y is the conductance matrix of the RC network. Given that an RC network matrix (Y) from the power supply network of today's VLSI circuit is quite large, including millions of resistors, it is very time-consuming to pre-condition the matrix to an efficient form for most sparse matrix solving techniques. It has also been discovered that RC network simulation must be performed for a group of successive simulation segments (peak segment packet) due to two reasons: to deal with lost charge and time constant problems and to consider the possibility of overlapping peak segment packets.

Figure 6:
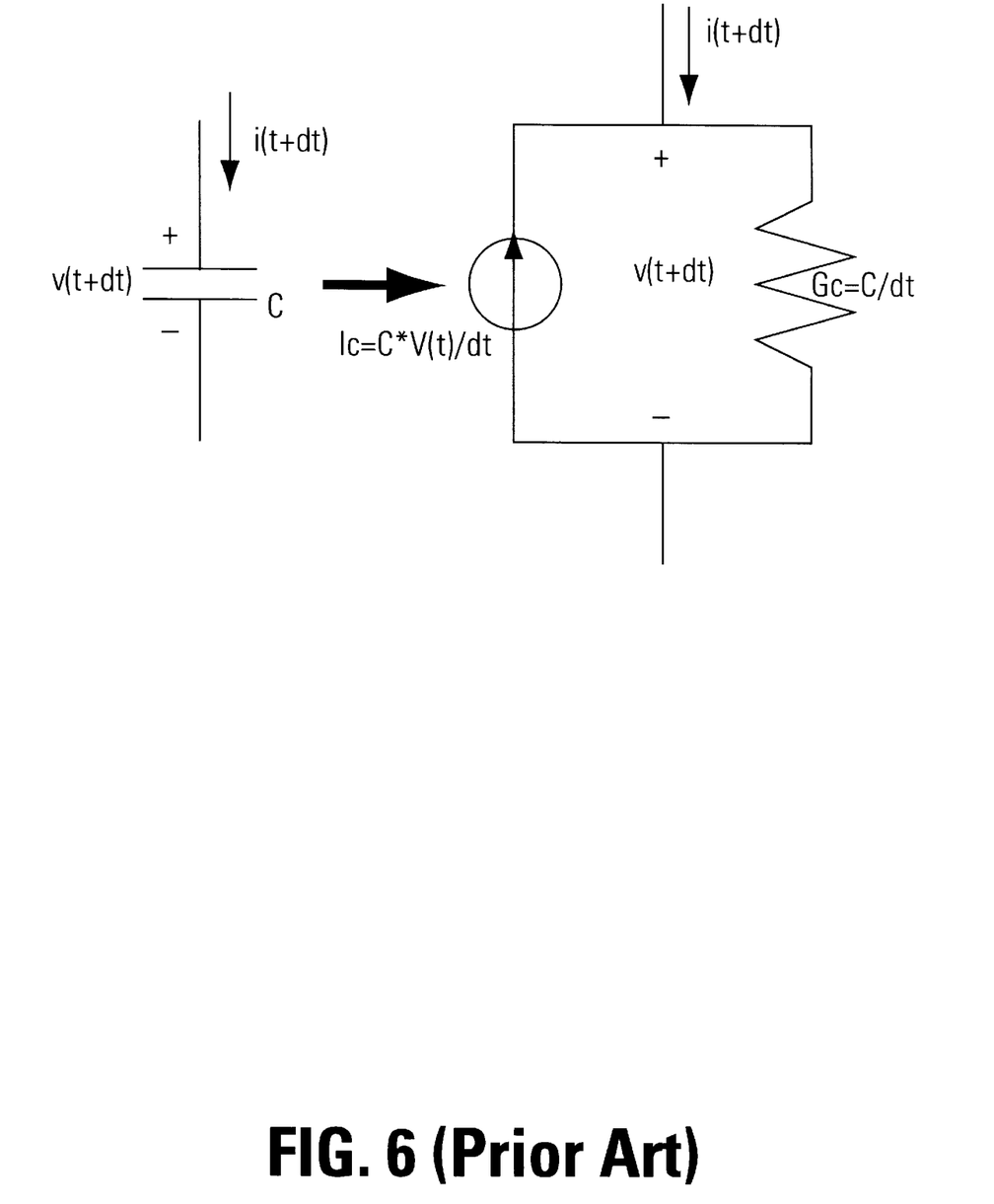
FIG. 6 shows how capacitors are represented in the power supply network with their linearized backward Euler model.

Based on the above discoveries, the entire simulation duration is divided into equal size segments and capacitors are represented in the power supply network with their linearized backward Euler model (parallel combination of the current source and the conductance), as shown in FIG. 6. The resistors are represented by their conductance. Since all segments have the same length, this model is valid as long as the segment length is kept small.

Figure 7:
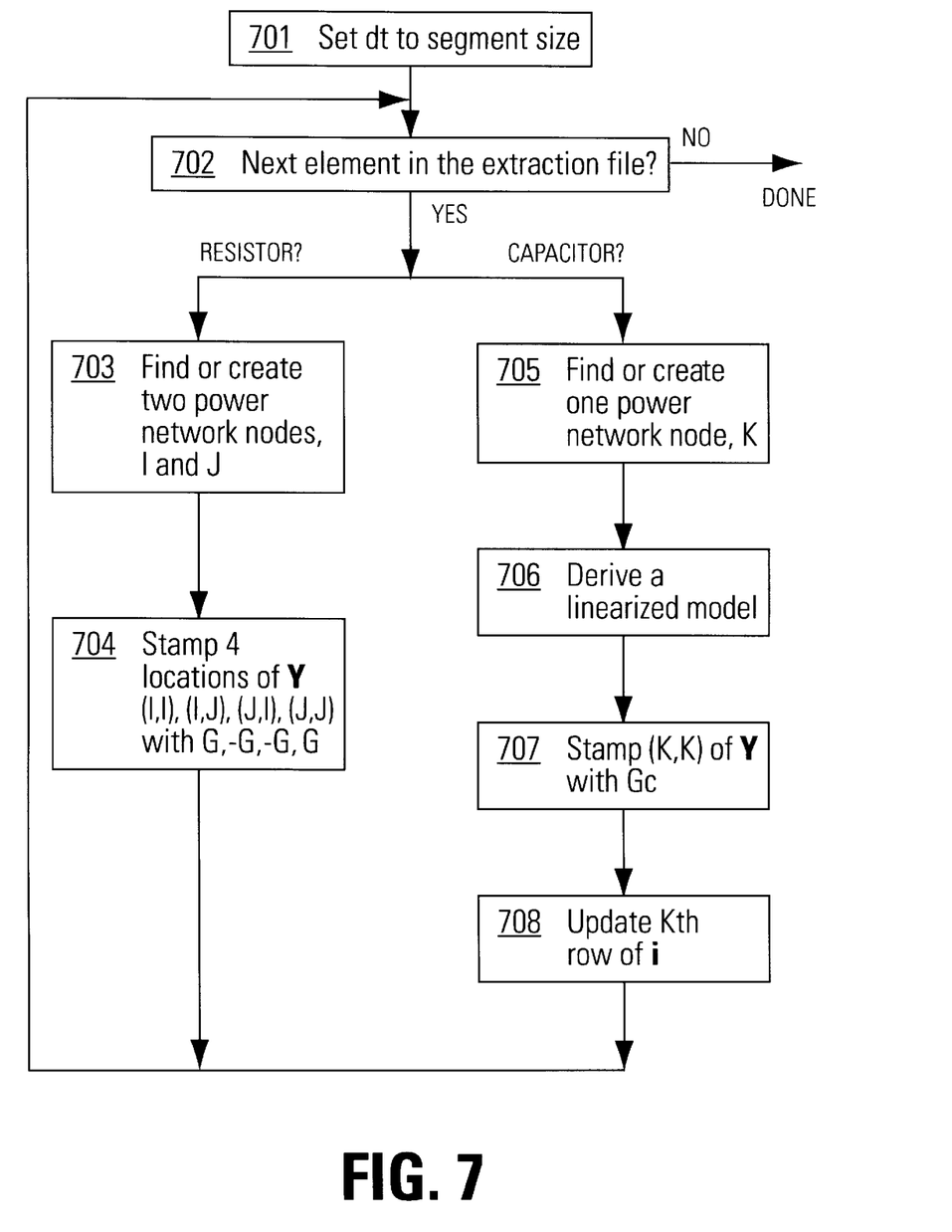
FIG. 7 is a flowchart describing the process for stamping the Y matrix.

The Y matrix is then stamped by the process described in the flowchart shown in FIG. 7. The matrix stamping (the process of assigning a value into the (I, I) location of the Y matrix) is performed while reading an RC component from the extraction file. The first step 701 is to set the segment size, dt. Next, an RC element is read from the extraction file, step 702. If there is not another element, the process is done. If there is another element, the process determines whether that element is a resistor or a capacitor. If it is a resistor, each of its two RC network nodes is first looked up in the hash table. If it exists, the corresponding RC network node is found. Otherwise, a new node is created and added into the hash table, step 703. Assuming that its two nodes are I-th and J-th nodes in v and its conductance is G, then (I, I), (I, I), (J, I), and (J, J) locations of the matrix are stamped with G, −G, −G and G respectively, step 704.

However, if it is a capacitor (node-to-ground capacitor in the extraction method), its non-ground node is looked up in the hash table, and a power network node is found or created, step 705. The other node is always the ground node. A linearized model is derived as explained above, step 706. Assuming that the non-ground node is K-th node in v, then the equivalent conductance in the linearized model is stamped into the (K, K) location of Y, step 707. The equivalent current is then added to the K-th row of i, step 708. Once the Y matrix stamping is finished, the matrix is pre-conditioned and decomposed into LU triangular matrices only once at the beginning of the program. Only the right hand side of the equation, Yv=i, is updated at each segment and the matrix equation is solved by backward and forward substitutions.

One embodiment of the present invention is to solve the RC network equation, Yv=i, for only those segments where one or more peak regional currents are detected. However, one needs to deal with two difficult problems to make this method work accurately. Assume that it is desired to solve the matrix equation at the i-th segment, Si. Since the RC network nodes have finite capacitance, one needs to know the initial node voltages at the beginning of Si to calculate the node voltages at the end of Si in addition to the value of i. However, the initial node voltages are unknown if the previous segment is skipped due to low switching activity. Another problem occurs from the finite time constant of the RC network. In other words, it takes time to drain (pump) the charge out of (into) the RC network nodes due to the time constant. Depending on the length of the segment, one segment may not be long enough to drain the charge from the RC network nodes and thus, to cause significant voltage drop. One solution to the above mentioned problems is to simulate the RC network not only for the segment where a regional peak is detected, but also for other segments around the peak segment. The collection of the peak segment and the segments around it is known as its peak segment packet. In the currently preferred embodiment, the size of the peak segment packet can be 2,3, or 5 segments, even though it can be of any size in general. The bigger packet size would lengthen the run time of the simulation but provide more accuracy.

Figure 8:
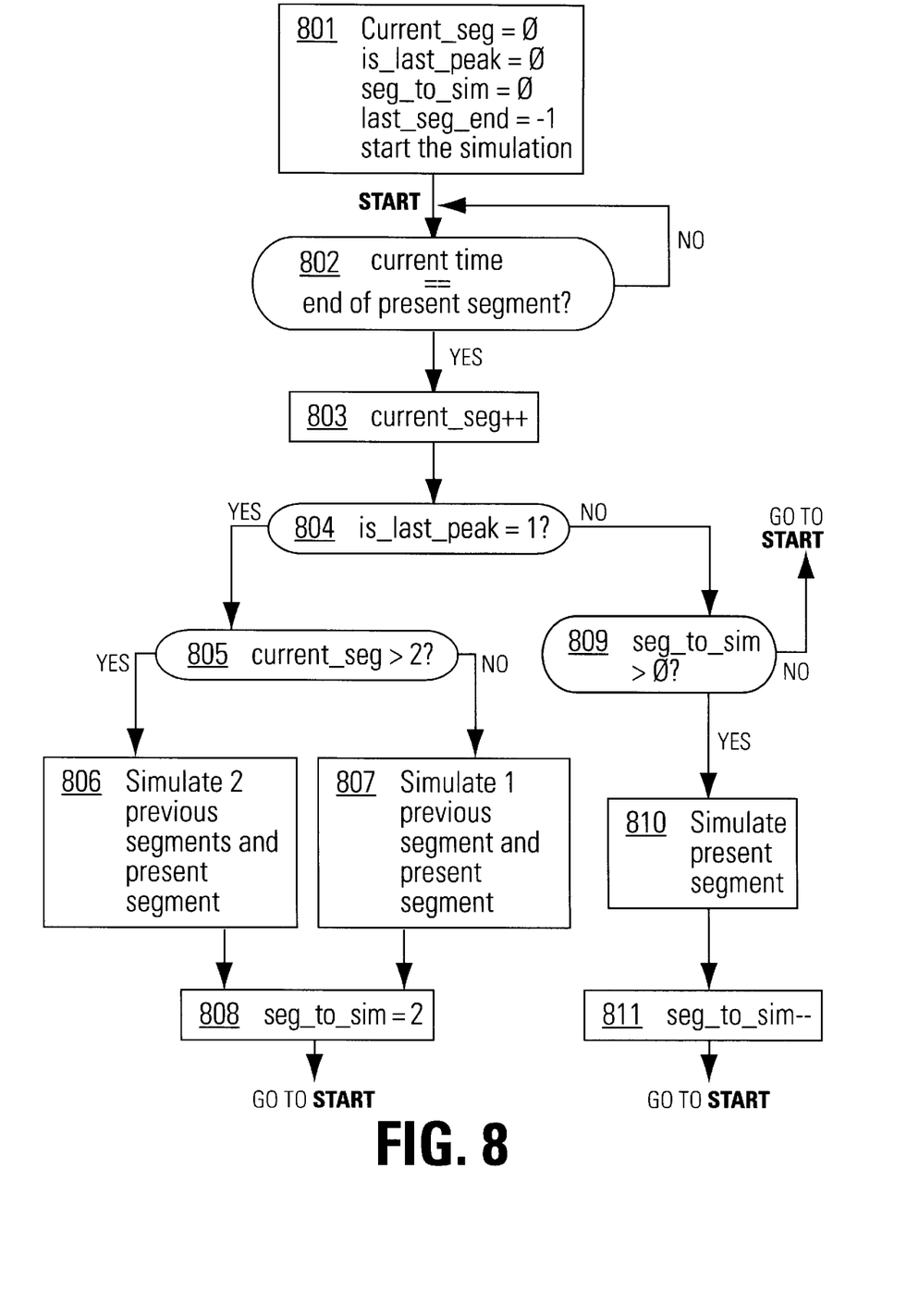
FIG. 8 is a flowchart describing peak segment packet simulation process.

The peak segment packet simulation process is now described in detail based on the flowchart of FIG. 8. For purposes of explanation, it is assumed that the size of the peak segment packet is five. During the initialization step 801, the current_seg, seg_to_sim, and is_last_peak variables are reset to 0. The last_seg_end is reset to negative one, and the simulation is started. A determination is made as to whether the current time is the End of the present segment, step 802. At the end of the present segment, the current_seg is incremented by 1, step 803, and a test is performed to determine whether a peak is detected in any region, step 804. If so, the last_peak variable is set to 1. If is_last_peak is 1, the two (one if current_seg is 2) previous and present segments are simulated, steps 806 and 807. The seg_to_sim variable is set to two, step 808. Otherwise, a test is performed to determine if seg_to_sim is greater than 0, step 809. If so, the present segment is simulated, step 810. And the seg_to_sim variable is decremented by one, step 811. Steps 802–811 are repeated until the end of the simulation.

At the beginning of the RC network simulation for each segment, we test if the beginning time of the simulation segment (the segment for which the RC network is being simulated) is the same as last_seg_end. If so, we keep the previous node voltages. Otherwise, we reset all node voltages to the supply voltage since its previous segment is skipped. At the end of the RC network simulation, we set last_seg_end to the end time of the simulation segment. This step is necessary to conserve the capacitor charge of the RC network across the consecutive segments.

Figure 9:
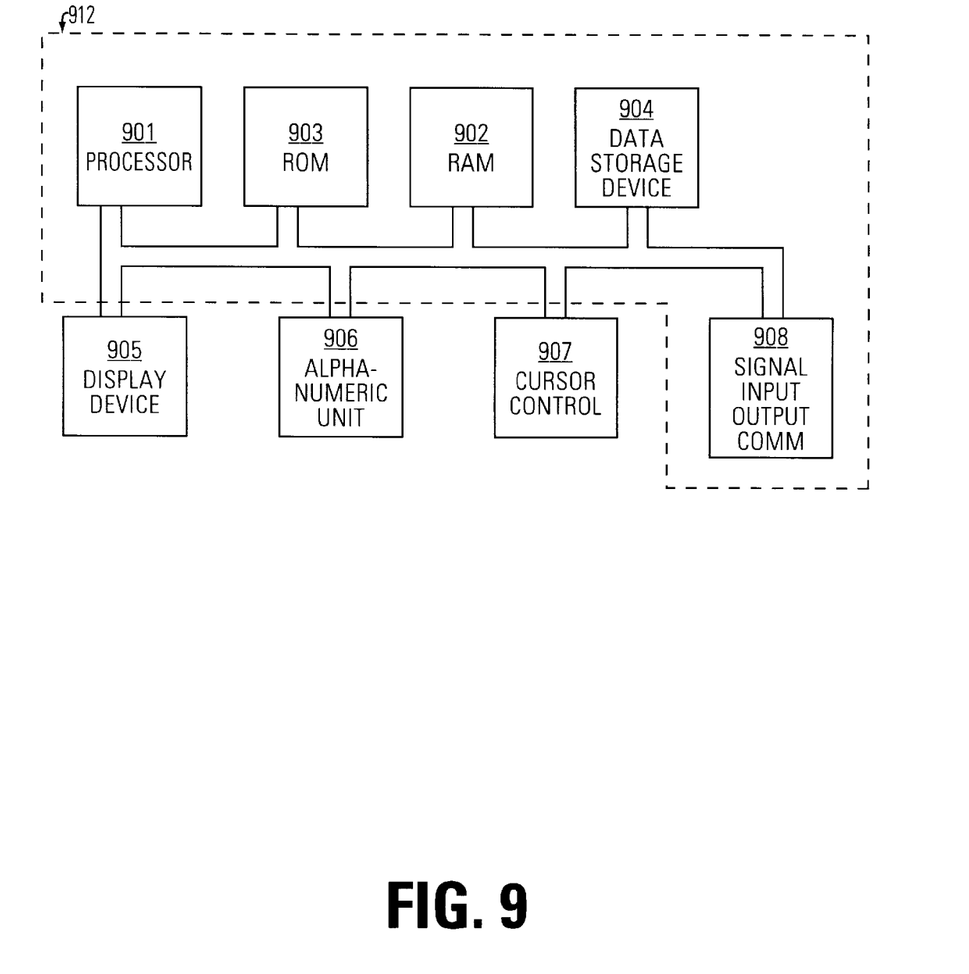
FIG. 9 shows an exemplary computer system upon which the present invention may be practiced.

Referring to FIG. 9, an exemplary computer system 912 (e.g., personal computer, workstation, mainframe, etc.) upon which the present invention may be practiced is shown. The reliability analysis tool to test and simulate the power network of semiconductor chips is operable within computer system 912. When configured with the simulation and testing procedures of the present invention, system 912 becomes a computer aided design (CAD) tool 912, for reliability analysis. The four stages of the present invention described in Figures are implemented within system 912.

In general, computer systems 912 used by the preferred embodiment of the present invention comprise a bus 900 for communicating information, a central processor 901 coupled with the bus for processing information and instructions, a computer readable volatile memory 902 (e.g., random access memory) coupled with the bus 900 for storing information and instructions for the central processor 901. A computer readable read only memory (ROM) 903 is also coupled with the bus 900 for storing static information and instructions for the processor 901. A random access memory (RAM) 902 is used to store temporary data and instructions. A data storage device 904 such as a magnetic or optical disk and disk drive coupled with the bus 900 is used for storing information and instructions. A display device 905 coupled to the bus 900 is used for displaying information to the computer user. And an alphanumeric input device 906 including alphanumeric and function keys is coupled to the bus 900 for communicating information and command selections to the central processor 901. A cursor control device 907 is coupled to the bus for communicating user input information and command selections to the central processor 901, and a signal input/output port 908 is coupled to the bus 900 for communicating with a network. The display device 905 of FIG. 9 utilized with the computer system 912 of the present invention may be a liquid crystal device, cathode ray tube, or other display device suitable for creating graphic images and alphanumeric characters recognizable to the user. The cursor control device 907 allows the computer user to dynamically signal the two dimensional movement of a visible symbol (pointer) on a display screen of the display device 905.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for dynamically testing a power supply network voltage drop of a semiconductor chip design in a simulation, comprising the steps of:

dividing the semiconductor chip design into a plurality of regions;

assigning transistors of a netlist to each of the plurality of regions;

receiving a plurality of input vectors;

dividing a total simulation time into a plurality of time segments;

determining average currents corresponding to the transistors for each of the plurality of regions and for each of the plurality of time segments using the plurality of input vectors;

detecting when a peak average current occurs for any one of the plurality of regions and for any one of the plurality of time segments;

analyzing the power supply network, of the semiconductor chip when the peak average current is detected to determine whether a voltage drop violation has occurred, wherein the voltage drop violation is determined only upon detection of the peak average current;

storing attributes of the violation for subsequent display to a user.

2. The method of claim 1, further comprising the steps of:

reading a transistor netlist file, a model file, and a stimuli file;

reading a segment size and a simulation step;

reading a power supply RC extraction file and a user command file;

connecting RC network nodes to transistor terminals;

allocating storage for transistor current collection;

allocating and stamping an RC network matrix.

3. The method of claim 1, further comprising the steps of:

reading a number of horizontal and vertical regions from a command file;

dividing the semiconductor chip into a plurality of regions having a predetermined size if the user does not specify a particular size;

creating a global region representing the entire semiconductor chip;

assigning all transistors to the global region;

assigning each transistor to one of the plurality of regions;

storing segment average current for the regions.

4. The method of claim 1, further comprising the step of implementing a linearized backward Euler model of a capacitor.

5. The method of claim 1 further comprising the steps of:

resetting a current simulation time to a first time segment;

starting a simulation engine;

determining whether a peak average current is detected, wherein if the regional current peak is detected:
simulating an RC network of the semiconductor chip;
calculating a voltage drop for a plurality of nodes of the RC network;
determining whether a violation has occurred, wherein violation criteria are written to a file.

6. The method of claim 1 further comprising the steps of:

simulating the semiconductor chip for two previous time segments and the current time segment if the peak average current is detected in any of the regions.

7. A method for analyzing supply voltage drops of a circuit, comprising the steps of:

initializing a simulation engine for simulating the circuit;

creating a plurality of regions corresponding to the circuit;

assigning each transistor of the circuit to one of the regions;

receiving a plurality of input vectors;

dividing a total simulation time into a plurality of time segments;

determining an average current for each of the regions for each of the time segments using the plurality of input vectors;

simulating the supply voltage drops of an RC network representing the circuit only when the peak average current is detected, wherein a voltage drop violation test is performed only upon detection of the peak average current;

setting a threshold;

comparing the voltage drop of each RC network node against the threshold.

8. The method of claim 7 further comprising the step of maintaining a peak average current for each of the regions, wherein the simulating step is performed only when a higher peak average current is detected for one of the regions.

9. The method of claim 7, wherein the simulation engine initializing step is comprised of the steps of:

constructing a simulation netlist from a transistor netlist file and a model file;

providing input stimulus to the simulation netlist;

constructing an RC network based on the circuit;

specifying a voltage drop threshold value and a duration corresponding to a violation condition.

10. The method of claim 7, wherein the simulation engine initializing step is comprised of the steps of:

establishing a duration for the time segments;

monitoring transistor current changes for each of the time segments;

adding the changes to an output buffer;

flushing the buffer at the end of each time segment;

collecting the current changes to determine a segment average value of each transistor at the end of each time segment;

driving an RC network based on the segment average value.

11. The method of claim 10 further comprising the step of storing a running segment average value and a segment average current.

12. The method of claim 7, wherein the simulation engine initializing step is comprised of the steps of:

recording (x,y) locations of an RC network conductance matrix for each resistor;

representing each capacitor by an equivalent linearized model.

13. The method of claim 7, wherein the step of creating a plurality of regions is comprised of the steps of:

specifying the number of horizontal and vertical regions if so specified by a user;

dividing the circuit into a plurality of regions having pre-defined dimensions if the number of regions are not specified by a user;

specifying a global region representing the entire circuit in addition to the plurality of regions;

assigning power net transistors to one of the regions according to location;

defining data fields for storing present and previous regional segment average current values and indicators indicating whether the current value is increasing or decreasing;

allocating storage for storing average current values for the present and previous time segments.

14. A computer-readable medium having stored thereon instructions for causing a computer to implement computer-controlled voltage drop analysis to be performed on a semiconductor chip design, comprising the steps of:

a) dividing the semiconductor chip design into a plurality of regions;

b) determining a current value for each of the regions for a pre-determined time interval;

c) determining whether there is a high degree of switching activity in one of the regions based on the current value determined for each of the regions and for each pre-determined time interval;

d) simulating the voltage drops for the semiconductor chip only when the high degree of switching activity is detected, wherein a voltage drop determination is performed only when a peak average current is detected;

e) determining whether an error condition has occurred;

f) repeating steps b–e until a simulation time elapses.

15. The computer-readable medium of claim 14, further comprising the steps of:

reading a transistor netlist file, a model file, and a stimuli file;

reading a segment size and a simulation step;

reading a power supply RC extraction file and a user command file;

connecting RC network nodes to transistor terminals;

allocating storage for transistor current collection;

allocating and stamping an RC network matrix.

16. The computer-readable medium of claim 14, further comprising the steps of:

reading a number of horizontal and vertical regions from a command file;

dividing the semiconductor chip into a plurality of regions having a predetermined size if the user does not specify a particular size;

creating a global region representing the entire semiconductor chip;

assigning all transistors to the global region;

assigning each transistor to one of the plurality of regions;

storing segment average current for the regions.

17. The computer-readable medium of claim 14, further comprising the step of implementing a linearized backward Euler model of a capacitor.

18. The computer-readable medium of claim 14 further comprising the steps of:

resetting a current simulation time to a first time segment;

starting a simulation engine;

determining whether a peak average current is detected, wherein if the regional current peak is detected:
simulating an RC network of the semiconductor chip;
calculating a voltage drop for a plurality of nodes of the RC network;
determining whether a violation has occurred, wherein violation criteria are written to a file.

19. The computer-readable medium of claim 14 further comprising the step of simulating the semiconductor chip for two previous time segments and the current time segment if the peak average current is detected in any of the regions.

20. A computer system for simulating voltage drops of an IC chip design, comprising:

a memory for storing a plurality of input stimuli;

a transistor simulation engine coupled to the memory that determines a current associated with each transistor of a power network as the input stimuli is applied;

a buffer coupled to the transistor simulation engine for storing the current values for a pre-determined time interval;

a power network simulation engine coupled to the buffer that divides the IC chip into plurality of regions, wherein an average current value is determined for each of the regions for each pre-determined time interval and the power network is simulated to determine node voltages of the power network only when the current corresponding to one of the regions reaches a local peak for that time interval.

21. The computer system of claim 20 further comprising a disk file coupled to the power network simulation engine for storing data corresponding to a voltage drop violations as detected by examining the node voltages.

22. The computer system of claim 21 further comprising a graphical chip viewer coupled to the power network simulation engine for displaying chip geometries and pinpointing areas of the IC chip which have violations.

* * * * *